(12) United States Patent
del Rosario et al.

(10) Patent No.: US 7,502,964 B2
(45) Date of Patent: Mar. 10, 2009

(54) SELECTING AND USING STORAGE DEVICES BASED ON FUNCTIONAL TESTS AND PROBABLE TIME TO FAILURE

(75) Inventors: Ramon Z. del Rosario, Milpitas, CA (US); Stephen A. Wynne, Fremont, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 714 days.

(21) Appl. No.: 11/118,187

(22) Filed: Apr. 29, 2005

(65) Prior Publication Data
US 2006/0248272 A1 Nov. 2, 2006

(51) Int. Cl.
G06F 11/00 (2006.01)
(52) U.S. Cl. .................................... 714/25; 711/114
(58) Field of Classification Search .............. None
See application file for complete search history.

(56) References Cited

U.S. PATENT DOCUMENTS

2003/0033398 A1* 2/2003 Carlson et al. .............. 709/223
2005/0066128 A1* 3/2005 Yagisawa et al. ............ 711/114
2006/0075191 A1* 4/2006 Lolayekar et al. .......... 711/114
2006/0236061 A1* 10/2006 Koclanes ................... 711/170

* cited by examiner

Primary Examiner—Michael C Maskulinski
(74) Attorney, Agent, or Firm—Blakely, Sokoloff, Taylor & Zafman LLP.

(57) ABSTRACT

The present invention includes combining mass storage devices having different probable time to failures into a single data storage system, so that most of the mass storage devices don't crash or become inoperable at the same time, such as when the system is exposed to a most probable failure causing setting or circumstances for the mass storage devices. Embodiments also include using a tiered system of functional testing, to identify "premium" mass storage devices for use in a premium data storage system, as compared to "standard" devices. The premium mass storage devices may not include reworked devices or components, and may have to pass a more stringent functional test than a test for a "standard" device. Also contemplated is use of a data storage system or server having standard or premium mass storage devices, and/or groups of mass storage device with different probable time to failure.

25 Claims, 6 Drawing Sheets

SELECTING AND USING STORAGE DEVICES BASED ON FUNCTIONAL TESTS AND PROBABLE TIME TO FAILURE

BACKGROUND

1. Field

The field generally relates to data storage devices and systems.

2. Background

A data storage device or system, such as a network server, file server, or Internet server may be used to store data for access by other entities, such as client devices. Such a data storage systems may include a number of mass storage devices, such as disk drives, where reading data from the drives and writing data to the drives is controlled by an operating system of the data storage system and/or a controller external to the data storage system. Often the disk drives are in a data storage system that is not physically inside, but is external to the network server or file server.

For example, a data storage system, may be a storage server having a special-purpose or general purpose operating system configured to provide storage services, such as to store and retrieve data on behalf of one or more client processing systems (clients). A storage server can be used for many different purposes, such as to provide multiple users with access to shared data or to backup mission critical data.

A file server is an example of a storage server. A file server operates on behalf of one or more clients to store and manage shared files in a set of mass storage devices, such as magnetic or optical storage based disks or tapes. The mass storage devices may be organized into one or more volumes of Redundant Array of Inexpensive Disks (RAID) and/or RAID groups.

The mass storage devices may be obtained from or provided by a number of manufacturers or vendors. Moreover, such mass storage devices may come from various batches of production, such as production batches of devices assembled from batches of components having similar characteristics and/or defects. As a result, a data storage system or server that includes mass storage devices from a single manufacturer or batch may suffer if these mass storage devices have the same probable time to failure. Specifically, if the data storage system or server is exposed to a setting or condition that exposes or exacerbates the most probable failure, plural mass storage devices may fail or experience functional errors simultaneously or within an undesirably short period of time. Thus, the data storage system may fail, become unusable, or become inoperable for an undesirably long period of time, or data may be lost or unrecoverable through normal RAID operations.

SUMMARY

The present invention includes combining mass storage devices having different probable times to failure into a single data storage system such as a single server, so that most of the mass storage devices don't fail or become inoperable at the same time, or suffer a failure rate over an undesirably short period of time, such as when the server is exposed to a most probable failure causing setting or circumstances for the mass storage devices. Embodiments also include using a system of functional testing, such as a tiered system or process to identify "premium" mass storage devices, such as for use in a premium data storage system or server, where the premium mass storage devices do not include reworked devices or components, and have passed a more stringent functional test than one according to the minimum requirements of the manufacturer's specification, or a test for a "standard" mass storage device. Also contemplated is use of a data storage system or server having standard or premium mass storage devices, and/or groups of mass storage device with different probable times to failure.

BRIEF DESCRIPTION OF THE DRAWINGS

Various features, aspects and advantages will become more thoroughly apparent from the following detailed description, the set of claims, and accompanying drawings in which:

DETAILED DESCRIPTION

To avoid failure, crashing, delay of use, or loss of data beyond a desired number, amount, or time for a data storage system having multiple mass storage devices (such as a file server), it is possible to include groups of mass storage devices having different probable time to failure in the data storage system. The combination of mass storage devices with different probable time to failure reduces the risk of an undesirable situation setting causing all or most of the mass storage devices to fail within an undesirably short period of time, such as when the data storage system is exposed to a single failure mechanism or condition for all or most of its mass storage devices. Undesirable situation settings may be settings including excessive (e.g., greater in amount than limits set by a specification of a device) heat, cold, moisture, magnetic field, electrical field, passage of time with or without operation of the device, etc. as known in the art. Moreover, such mass storage devices may be selected to exclude those that were reworked, include reworked components, or have not passed a functional test more stringent than a test according to the manufacturers minimum test standards or a test for a "standard" mass storage device.

A data storage system as defined herein may include or be part of a data server, a network server, an Internet server, a memory, a random access memory (RAM), firmware, and/or a data storage system using magnetic, optical, electronic, biological, or other data media. It is also considered that a data storage system as described herein may be on include a redundant array of independent disks (RAID). In addition, a data storage system as described herein may include one or more mass storage devices, such as by including 2, 3, 4, 10, 20, 40, 80, 100, 200, 400, 800, a combination thereof, or any number of mass storage devices. In addition, a mass storage device as described herein may include a disk drive, a hard disk drive (HDD), an optical disk drive, a magnetic disk drive, a flash memory, RAM, firm ware, or other memory including magnetic, optical, electronic, biological, or other media capable of storing data (e.g., being written to) and having data retrieved therefrom (e.g., being read). It is contemplated that a mass storage device may be or may be included in a RAID array, a RAID group, a RAID volume. Moreover, a mass storage device may implement RAID level 4, RAID-DP (a RAID implementation developed by Network Appliances of Sunnyvale, Calif.), or another RAID type system.

Figure 1:
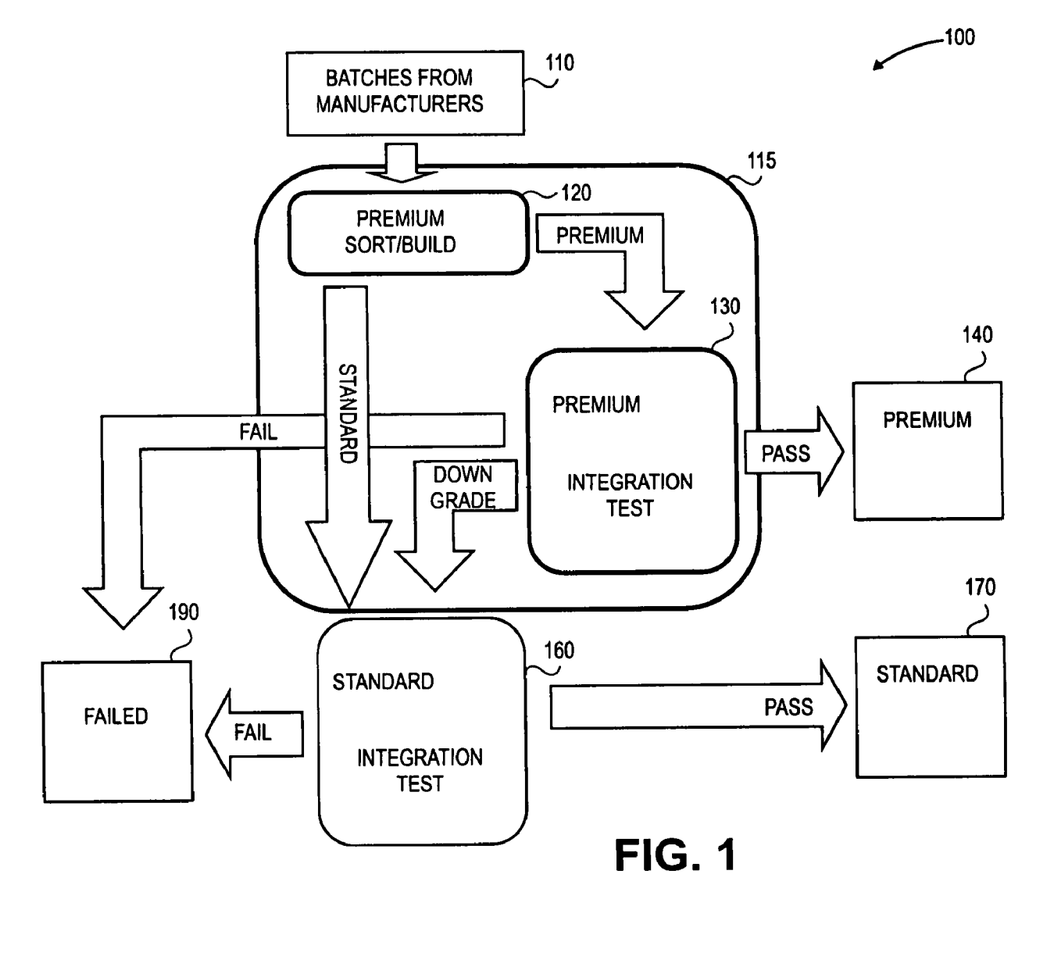
FIG. 1 shows a process for selecting premium and standard devices.

Thus, a data storage system with improved reliability and availability can be produced by properly selecting mass storage devices, such as magnetic or optical disks. FIG. 1 shows a process for selecting premium and standard devices. It is considered that the process of FIG. 1 may be applied to various electronic devices, computing devices, and components thereof, such as mass storage devices. FIG. 1 may be an automated process, such as a process performed or managed by a machine or computer system. The automated process may include a processor executing instructions (e.g., such as a software application, source code, or compiled code application) stored in a machine-accessible media, such as in a memory, magnetic or optical media, a compact disk read only memory (CDROM), that when executed by the processor to cause the machine or computer to perform the functions of FIG. 1. Alternatively, FIG. 1 may include some or only tasks performed by a person. Thus, the process of FIG. 1 may be performed partially by a person and partially by machines and/or computers.

FIG. 1 shows process 100 including premium selection process 115 receiving batches of devices or mass storage devices from manufacturers 110. For example, batches from manufacturers 110 may be one or more batches of mass storage devices from one or more manufacturers. A batch may include a production batch, as known in the art. Moreover a batch may be a batch of mass storage devices produced by a single manufacturer, single plant, single production line, or according to a single batch process. Block 110 may represent one manufacturer providing two or more batches. Alternatively, block 110 may represent each of more than one manufacturer providing one or more batches. It is also considered that the manufacturers of block 110 may be a vendor, a distributor, a salesman, or various other sources of mass storage devices as known in the industry.

Also, a batch or a batch of devices as described herein may include one or more, such as one or more devices, including one or more components of one or more batches. Moreover, a batch, batch of devices, or batch of components may include those from a single manufacturer (e.g., as described with respect to block 110), those created without deviating from a similar or single process, set of materials, specification, revision, "build", configuration, modification, mark, model, or other delineator of a batch as known in the art. A batch may be assembled from batches of components having similar characteristics, such as size (e.g., maximum data storage size capability), and/or defects.

At block 120, a premium sort is performed. For example, block 120 may correspond to selecting mass storage devices which have not been reworked or do not include reworked components. Rework as described herein may include a device which has failed a functional test, such as a premium or standard functional test as described herein. Thus, it is considered that rework may include a device which has had some or all components replaced, repaired, serviced, treated, upgraded, updated, rewritten, overwritten, modified, cleaned, erased, polished, de-gaussed, electronically discharged, magnetically discharged, or otherwise altered or modified to improve the performance or correct failures of the device or components thereof. Specifically, in some cases, rework is a function performed by the manufacturer of the device.

At block 120, those mass storage devices sorted premium are sent to block 130, and those sorted standard, are sent to block 160. For example, those mass storage devices not sorted premium may be considered standard or vice versa. Alternatively, it is contemplated that block 120 may include sorting mass storage devices other than only premium and standard, such as by sorting failed or otherwise. At block 130, a premium integration test is performed. Block 130 may include testing, functional testing, or other testing to standards more stringent, more rigorous, longer in time, greater in number, or greater than that of a "standard" test, such as to determine whether performance is greater than the minimum requirements according to a manufacturer's or other specification. For instance, block 130 may include a premium test as described further below for block 230 of FIG. 2. Devices that pass such a premium test may be expected to or may actually perform at a level better than or greater than a standard device, or for a period greater than that of a standard device without failing or "crashing". It is considered that a device that passes a premium test may be more reliable, function longer, fail less frequently, have fewer read/write errors, have fewer data errors, have fewer failed medium errors, and/or have fewer types of failures as compared to a non-standard device. Those mass storage devices that pass the premium integration test at 130 go to block 140 and are considered premium. Those mass storage devices that fail the premium integration test at 130 go to block 190 and are considered failed. For example, block 190 may include those mass storage devices that would not pass a standard integration test as described below with respect to block 160. Moreover, block 190 may include those mass storage devices failed, such as those to be returned to the manufacturer, such as for rework.

At block 130, those mass storage devices that do not pass and do not fail are downgraded to block 160. For example, those mass storage devices downgraded may be those that are unable to function or perform to a level greater than that of a "standard" test or greater than the minimum requirements according to a manufacturer's or other specification, but do not fail, or perform below a "standard" test, or below minimum requirement of a manufacturer's or other specification.

At block 160, a standard integration test is performed. For example, block 160 may include testing, functional testing, or other testing according to a "standard" test, or according to minimum requirement of a manufacturer's or other specification. Those that pass the standard integration test at block 160 go to block 170. Those at block 170 are considered standard, such as standard according to a standard test or manufacturer's specification.

Those mass storage devices that fail the standard integration test at block 160 go to block 190 and are considered failed mass storage devices.

Thus, FIG. 1 may be considered to define a "tiered" process or system having premium selection process 115 as a first tier to select premium mass storage devices according to blocks 120 and 130; and a second tier to select standard mass storage devices including test 160 and downgrading of mass storage devices not selected as premium.

Figure 2:
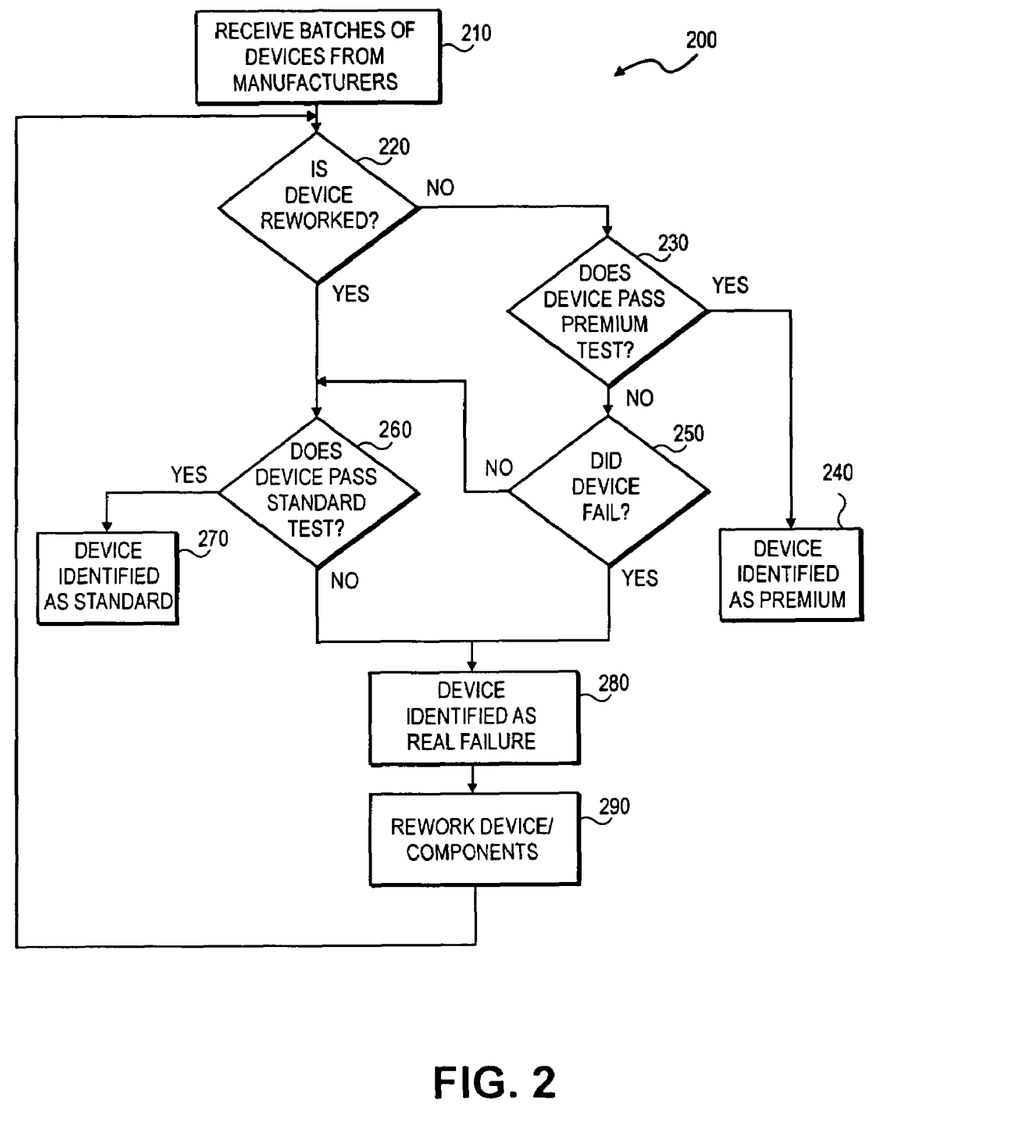
FIG. 2 is a flow diagram of a process for selecting premium and standard devices.

Further expounding upon FIG. 1, FIG. 2 is a flow diagram of a process for selecting premium and standard devices. It is considered that the process of FIG. 2 may be applied to various electronic devices, computing devices, and components thereof, such as mass storage devices. FIG. 2 includes process 200, which may further define, modify, or expound upon process 100. At block 210 of process 200, batches of mass storage devices are received from one or more manufacturers. Block 210 may include the description above with respect to block 110.

At block 220, it is determined whether a device is or has been reworked. Block 220 may include the description above of block 120. Moreover, block 220 may include determining whether a mass storage device, disk drive, or one or more components thereof have been reworked, or previously tested by a functional test, such as a premium integration test according to block 130, a premium test according to block 230, a standard integration test according to block 160, or a standard test according to block 260 described below, and/or another functional test as described herein. It is contemplated that block 220 may exclude or include finding a device reworked that has failed one or more tests at the manufacturer, but has not been received from the manufacturer or an entity described above with respect to block 110. If at block 220 it is determined that a device has been reworked, processing continues to block 260. Alternatively, if at block 220 it is determined that a device has not been reworked, processing continues to block 230.

At block 260, it is determined whether a device passes a standard test. Block 260 may include the description above with respect block 160. Moreover, block 260 may include a test or functional test to determine whether a mass storage device performs sufficiently for use in a data storage system or data server, such as according to various test types, specifications, factors, goals, and theories. For example, block 260 may include a "standard" test to determine whether a mass storage device performs according to "standard" specifications, and/or minimum requirements according to a manufacturer's or other specification. Specifically, block 260 may include testing according to the "standard" or minimum requirements of the manufacturer's specification for the mass storage device being tested. In some cases, a standard test may include one or more of an integration test, a performance test, a read test, a write test, a read/write test, a read/write speed test, a sector defect test, a stress test, an environmental test, a test under adverse or temperature conditions, and a test for a desired period of time. Block 260 may include a test to verify that a device performs below, above, or within a threshold, period of time, rate, speed, accuracy, and/or capability.

In addition, block 260 may include allowing up to a standard number of failed codes or failures according to a "standard" specification, and/or a manufacturer's or other specification without failing the standard test. In some cases, the standard test may include a test, of no longer than 24 hours and no more than three grown defects per 100 Giga-Bytes. Also, 260 may include a test for standard performance as known in the art. At block 260, if the device passes the standard test processing, proceeds to block 270. Alternatively, if at block 260 the device does not pass the test, such as by failing the test, processing continues to block 280.

At block 270, the device is identified as a standard device. Block 270 may include the description above with respect to block 170. Moreover, block 270 may include identifying the device as a device having passed a standard test as described with respect to block 260. In addition, block 270 may include identifying the device for inclusion in a "standard" data storage system, such as a data storage system that is expected to or does perform according to "standard" specifications, and/or minimum requirements of a manufacturer's or other specifications as known in the art for that data storage system.

At block 230, it is determined whether the device passes a premium test. Block 230 may include the description above with respect to block 130. Moreover, block 230 may include testing to determine whether a mass storage device performs according to requirements greater, more stringent, more rigorous, longer in time, greater in number, or more difficult than those described with respect to block 260. Also, tests included at block 230 may include those described above with respect to block 260. For example, block 230 may include one or more tests as described with respect to block 260 for a period of time that is greater than a period of time according to a "standard" specification and/or minimum requirements according to a manufacturer or other specification (e.g., for the device being tested); and/or to a threshold that is more difficult or stringent, or higher than a test threshold of a "standard" test as described with respect to block 260.

In some cases, block 230 may include allowing fewer than a standard number of failed codes or failures according to a "standard" specification, and/or the minimum number of failed codes or failures allowed without failing a device according to a manufacturer's or other specification (e.g., such as a specification for the device being tested). It is considered, that block 230 may include testing for a period of longer than 24 hours, and allowing no additional grown defect entries. Thus, block 230 may be considered as testing for "premium performance."

Finally, block 230 may include a functional test requiring performance for a test period that is greater than a test period for a standard test as described for block 260, at performance thresholds more difficult than minimum threshold of a standard test described for block 260, and/or with fewer failed codes than an allowable number of failed codes as described with respect to block 260. In some cases, block 230 may include the tests described for block 260 but where the device is tested for a test period that is greater than a period of a test according to a manufacturer's specification, at performance thresholds more difficult than minimum thresholds of a test according to a manufacturer's specification, and/or with fewer failed codes than a minimum allowable number of failed codes according to the manufacturer's specification.

If at block 230, the device passes the premium test, processing continues to block 240. Alternatively, if at block 230, the device does not pass the premium test, processing continues to block 250.

Next block at 240, the device is identified as a premium device. Block 240 may include the description above with respect to block 140. Moreover, block 240 may include identifying the device as a device having passed a premium test as described with respect to block 230 and/or not being or including a reworked device or components as described with respect to block 220. In addition, block 240 may include identifying the device, such as a mass storage device as a premium device, such as for use in a premium data storage system that is expected to or actually performs at a level better than or greater than a standard device, or for a period greater than that of a standard device without failing or "crashing". At block 240, it is considered that a device identified as a premium device may be identified as a non-standard device, or a device that functions better than a "standard" device, or for longer than a standard device without failing or "crashing".

At block 250, it is determined whether the device that did not pass at block 230 failed. Block 250 may include descriptions above with respect to block 130. Moreover, block 250 may include determining whether performance of a device at block 230 was in accordance with or would have passed the standard test of block 260. Also, it is considered that block 250 may include determining whether during testing at block 230, a device performed according to standard performance, as known in the art.

At block 290, the device or components thereof are reworked. Block 290 may include description above with respect to block 190.

At block 280, devices are identified as real failures. Block 280 may include the description above for block 190. Moreover, block 280 may include identifying devices or mass storage devices as "real" failures, such as devices that did not pass the test at block 230 and failed at block 250; or devices that did not pass at block 230, did not fail at block 250, and did not pass at block 260; or devices that failed the test at 260.

After block 290, processing may return to block 220. Alternatively, it is considered that after block 290, processing may return to block 260, such as by automatically considering a device that is reworked or has reworked components as ineligible for block 230 as described above with respect to block 220 and/or block 120.

The movement from block to block within process 100 or process 200 as described herein may be defined as identifying or selecting one, more than one, a plurality, or a subset of devices, mass storage devices, and/or disk drives.

The description above with respect to process 100 and/or 200 may be termed a "tiered" process, tiered system, tiered testing, and/or tiered system HDD shelf test process. Such a tiered process may be characterized by a first tier including sorting at block 120 or 220 and/or testing at block 130 or 230. The second tier includes testing a block 160 or 260 those sorted at block 120 or 220 as non-premium and/or a subset of those not passing testing at block 130 or 230.

Figure 3:
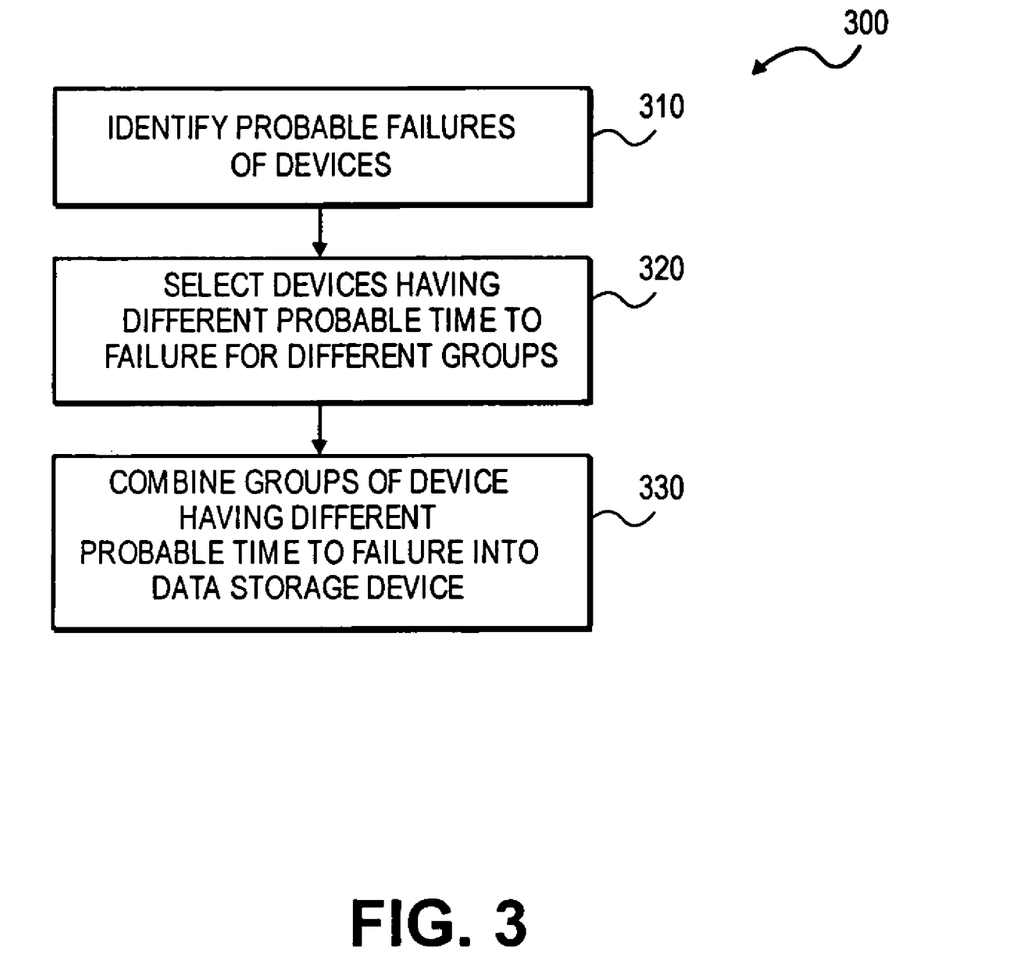
FIG. 3 is a flow diagram of a process for combining groups of devices having different probable time to failure.

FIG. 3 is a flow diagram of a process for combining groups of devices having different probable time to failure. It is considered that the process of FIG. 3 may be applied to various electronic devices, computing devices, and components thereof, such as mass storage devices. FIG. 3 may be an automated process, such as a process performed or managed by a machine or computer system. The automated process may include a processor executing instructions (e.g., such as a software application, source code, or compiled code application) stored in a machine-accessible media, such as in a memory, magnetic or optical media, a compact disk read only memory (CDROM), that when executed by the processor to cause the machine or computer to perform the functions of FIG. 3. Alternatively, FIG. 3 may include some or only tasks performed by a person. Thus, the process of FIG. 3 may be performed partially by a person and partially by machines and/or computers.

FIG. 3 includes process 300 which may be performed independently or may be performed after block 270 or block 240 of FIG. 2. At block 310, probable time to failure of a device is identified. For example, block 310 may include identifying various potential failures having various probabilities of occurring under various settings or circumstances, and/or occurring after various periods of time. Such failures may include mass storage device "crashes", temporary failures, permanent failures, media failures, temperature failures, head crashes, thermal asperities, bad sectors, read failures, write failures, read/write failures, read/write speed failures, access failures, performance failures, performance criteria failures, failures according to "standard" specifications, failures according to a manufacturer's specification, failures according to the manufacturer's specification for the device, failures according to another specification, were predicted, potential, or probable failures thereof.

Also, block 310 may include identifying the probability of such failures, such as a probability of a fraction of a percent, 1%, 2%, 4%, 8%, 10%, 20%, 40%, 80%, any combination thereof, or any number percent of failure over a period of time. This probability of failure may or may not depend upon an amount of use over that period of time of a device. In addition, block 310 may include testing or considering results of testing as described above with respect to block 130, 160, 230, 250, and/or 260. Specifically, block 310 may include ranking failures of each device from the most probable value to the least probable failure according to probability of a failure occurring over a selected or predetermined period of time. Also, block 310 may include identifying a most probable time to failure for a device with or without identifying other probable failures of the device.

At block 320, devices having different probable time to failure are selected for inclusion in different groups. Block 320 may include selecting one or more devices having the same, similar, or related most probable failures for inclusion in different groups. It is also considered that block 320 may include considering probable failures other than the most probable failure of devices when selecting devices for different groups.

It is also contemplated that block 320 may include or result in groups of devices from one or more batches and/or from one or more manufacturers as described above with respect to blocks 110 and 210. For example, one or more groups in block 320 may include devices from only one manufacturer, more than one manufacturer, only one batch, or more than one batch.

At block 330, the groups of devices having different probable time to failure are combined into a data storage system. Block 330 may include combining groups as described above with respect to block 320. In addition, block 330 may include combining groups that have various probable times to failure as described above with respect to block 320 into a data storage system. Also, block 330 may include combining one or more devices of any group described with respect to block 320 into a data storage system.

Groups of devices as described herein may be a portion of one or more RAID arrays, RAID groups, RAID volumes. Moreover, groups of devices may implement RAID level 4, RAID-DP (a RAID implementation developed by Network Appliances of Sunnyvale, Calif.), or another RAID type system.

For example, block 330 may include selecting or identifying one or more mass storage devices having a first probable time to failure and one or more storage devices having a different second probable time to failure to be combined, connected, coupled, mixed, joined, or appended into a single data storage system. Furthermore, block 330 may include combining mass storage devices from 1, 2, 4, 8, 10, 20, 40, a combination thereof, or any number of groups into a data storage system, where the groups are groups as described with respect to block 320. Moreover, as noted above, the groups combined into the data storage system at block 330 may be groups including only standard, or only premium devices as described above with respect to blocks 140, 240, 170, and/or 270. In some cases, block 330 may include combining at least three groups where each group has drives from a different manufacturer than the other group. Also, block 330 may include combining at least three groups, where each group has drives from a different batch than the other groups.

In addition, it is considered that block 330 may include combining groups of only "premium" devices or mass storage devices for the purpose of creating a "premium" data storage system with exceptional reliability; only "standard" devices or mass storage devices for the purpose of creating a "standard" data storage system with standard reliability; or a combination of premium and standard devices or mass storage devices for creating a data storage system with a reliability rating somewhere in between. It is also considered that block 330 may include combining devices that are other than premium or standard devices, such as devices meeting other technical standards, quality standards, or testing standards as known in the art.

Testing, selecting, sorting, determining, identifying, combining, and/or other processes described above with respect to FIGS. 1-3 may be performed by a manufacturer, a vendor, a distributor, a salesperson, a purchaser, an integrator (e.g., a system integrator), an assembler (e.g., assembling modules or systems), a hired entity, or various other entities between a manufacturer and an end user of mass storage devices as known in the industry.

It can be appreciated that as the purpose of a mass storage device or data storage system becomes more important, so too may be the reliability of devices and mass storage devices used therein. As such, a premium data storage system and/or a data storage system including mass storage devices having different most probable failures may be used for important purposes, such as for military, safety, nuclear, critical data, intelligence, fighting crime, and/or fighting terrorism purposes. Specifically, premium devices, mass storage devices, and/or data storage systems described above may be used in or may be part of such a network environment. The network environment may include premium and standard mass storage devices or data storage systems. Similarly, data storage systems including mass storage devices having different most probable failures may be used in or may be part of such a network environment.

For instance, use of a data storage system or server having standard or premium mass storage devices, and/or groups of mass storage device with different probable time to failure is contemplated. Specifically, data may be read from and written to a data storage system having mass storage devices having a first probable time to failure and other mass storage device having a second probable time to failure, different from the first probable time to failure. The first and second probable time to failure may be determined by or may consider times to failure identified according to a functional test (e.g., such as a premium and/or standard functional test) of a plurality of mass storage devices from a plurality of production batches. Also, mass storage devices having a first probable time to failure may be all or part of a Redundant Array of Inexpensive Disks (RAID) group. Likewise, mass storage devices having a first probable time to failure may be all or part of a different RAID group Moreover, data may be read from and written to a data storage system having at least one mass storage device having a subset of disk drives from a plurality of production batches, where each disk drive of the subset is a "premium" disk drive. For instance, such premium disk drives may each be a disk drive that is not a reworked disk drives. Also, each premium disk drives may have passed a functional test requiring: a) performance for a test time period that is greater than a period of a test according to a manufacturer's specification, b) performance at thresholds more difficult than minimum thresholds of a test according to a manufacturer's specification, and/or c) performance with fewer failed codes than a minimum allowable number failed codes according to the manufacturer's specification.

The subset may also include at least three groups, each group having a different probable time to failure than any other group. In some cases, each group may be or include a RAID group.

Figure 4:
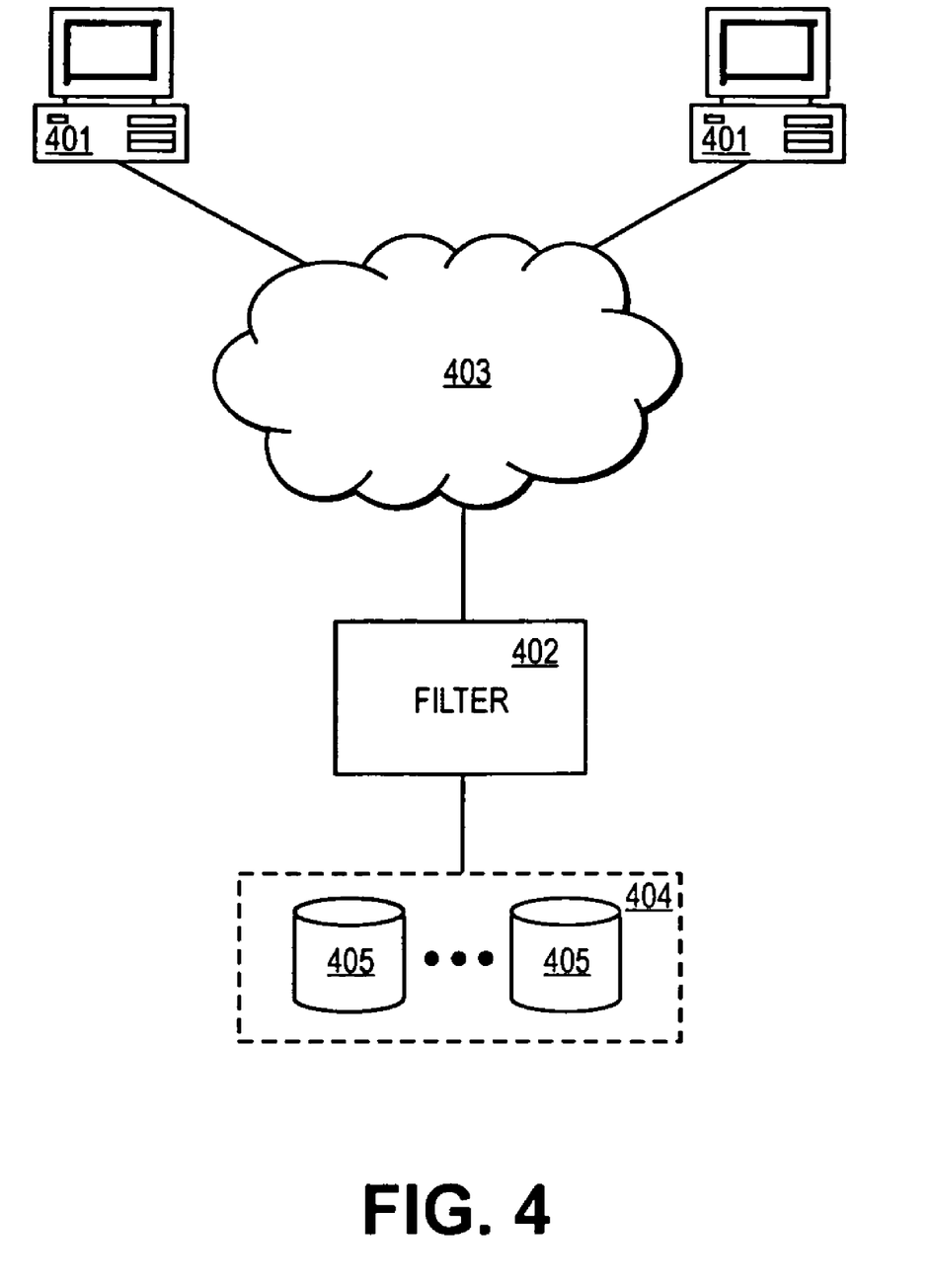
FIG. 4 shows an example of a network environment.

As noted, a data storage system described herein can be implemented in a file server. For example, FIG. 4 shows an example of a network environment that can include data storage systems having premium devices and/or mass storage devices selected according to the process of FIGS. 1-2, as well as combined groups of devices and/or mass storage devices as described above with respect to the process of FIG. 3. FIG. 4 shows a simple example of a network environment which incorporates a file server 402. Note, however, that the techniques of combining mass storage devices having different most probable failures, and the tiered processes to identify "premium" mass storage devices introduced herein are not limited to use in traditional file servers. For example, the techniques and/or processes can be adapted for use in other types of storage systems, such as storage servers which provide clients with block-level access to stored data or processing systems other than storage servers.

The file server 402 in FIG. 4 is coupled locally to a storage subsystem 404, such as one or more of data storage system 405 (and system 405 may include a set of mass storage devices), and to a set of clients 401 through a network 403, such as a local area network (LAN). Each of the clients 401 may be, for example, a conventional personal computer (PC), workstation, or the like. The storage subsystem 404 is managed by the file server 402. The file server 402 receives and responds to various read and write requests from the clients 401, directed to data stored in or to be stored in the storage subsystem 404. The mass storage devices of data storage system 405 in the storage subsystem 404 may be, for example, conventional magnetic disks, optical disks such as CD-ROM or DVD based storage, magneto-optical (MO) storage, or any other type of non-volatile storage devices suitable for storing large quantities of data.

The file server 402 may have a distributed architecture; for example, it may include a separate N-(network) blade and D-(disk) blade (not shown). In such an embodiment, the N-blade is used to communicate with clients 401, while the D-blade includes the file system functionality and is used to communicate with the storage subsystem 404. The N-blade and D-blade communicate with each other using an internal protocol. Alternatively, the file server 402 may have an integrated architecture, where the network and data components are all contained in a single box. The file server 402 further may be coupled through a switching fabric to other similar file servers (not shown) which have their own local storage subsystems. In this way, all of the storage subsystems can form a single storage pool, to which any client of any of the file servers has access.

Figure 5:
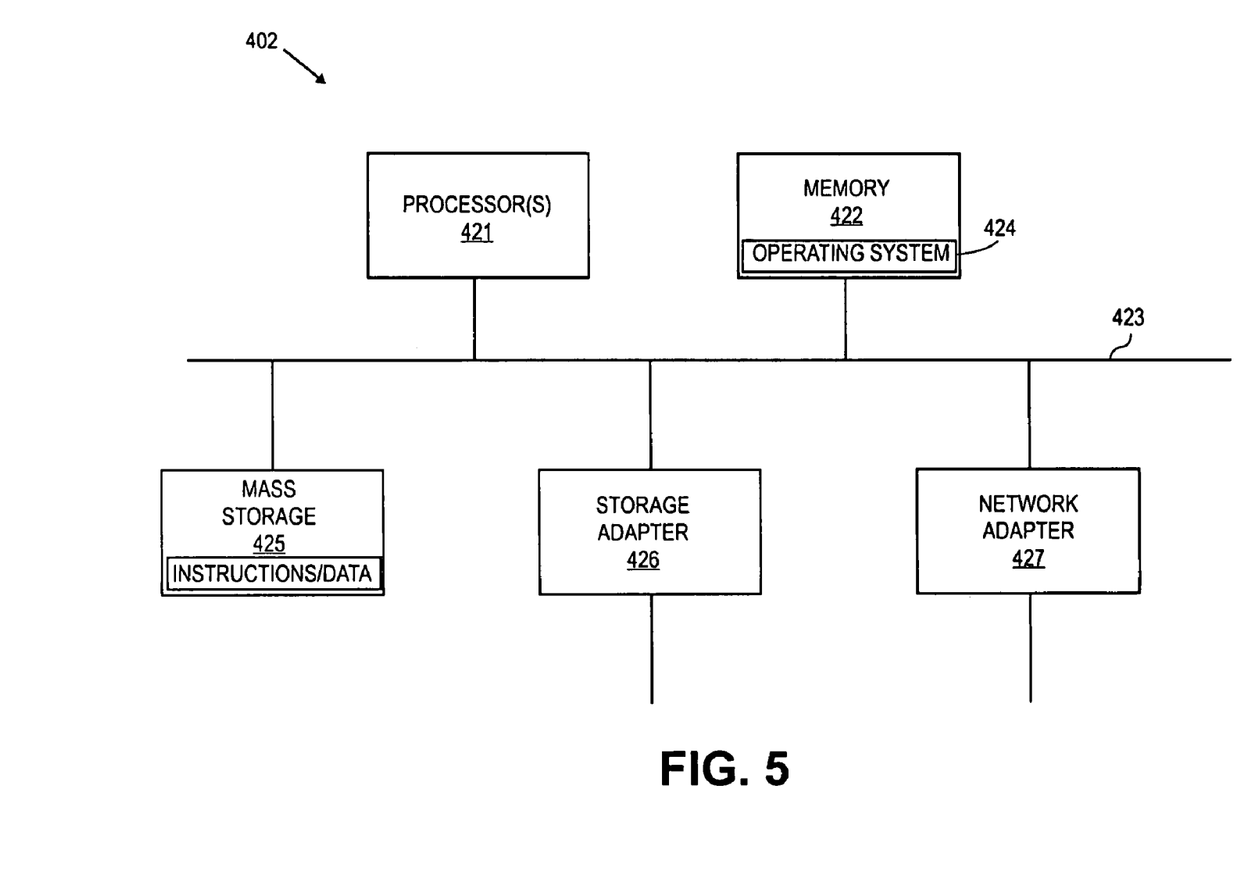
FIG. 5 is a block diagram showing an architecture of a file server that can implement the invention.

FIG. 5 is a block diagram showing an architecture of a file server that can implement the invention. For example, mass storage devices and/or data storage systems including premium devices selected in accordance with FIGS. 1-2 may be part of or attached to the file server of FIG. 5. In addition to premium devices, the file server may include standard devices. Similarly, mass storage devices and/or data storage systems including devices and/or mass storage devices having different most probable failures grouped and/or combined in accordance with FIG. 3 above, may be part of or attached to the file server of FIG. 5.

FIG. 5 is a block diagram showing the architecture of the file server 402, according to certain embodiments of the invention. Certain standard and well-known components which are not germane to the present invention may not be shown. The file server 402 includes one or more processors 421 and memory 422 coupled to a bus system 423. The bus system 423 shown in FIG. 5 is an abstraction that represents any one or more separate physical buses and/or point-to-point connections, connected by appropriate bridges, adapters and/or controllers. The bus system 423, therefore, may include, for example, a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (sometimes referred to as Firewire).

The processors 421 are the central processing units (CPUs) of the file server 402 and, thus, control the overall operation of the file server 402. In certain embodiments, the processors 421 accomplish this by executing software stored in memory 422. A processor 421 may be, or may include, one or more programmable general-purpose or special-purpose microprocessors, digital signal processors (DSPs), programmable controllers, application specific integrated circuits (ASICs), programmable logic devices (PLDs), or the like, or a combination of such devices.

Memory 422 is or includes the main memory of the file server 402. Memory 422 represents any form off random access memory (RAM), read-only memory (ROM), flash memory, or the like, or a combination of such devices. Memory 422 stores, among other things, the operating system 424 of the file server 402, in which the error detection techniques introduced above can be implemented.

Also connected to the processors 421 through the bus system 423 are one or more internal mass storage devices 425, a storage adapter 426 and a network adapter 427. Internal mass storage devices 425, a storage adapter 426 and a network adapter 427. Internal mass storage devices 425 may be or include any conventional medium for storing large volumes of data in a non-volatile manner, such as one or more magnetic or optical based disks. The storage adapter 426 allows the file server 402 to access the storage subsystem 404 and may be, for example, a Fibre Channel adapter or a SCSI adapter. The network adapter 427 provides the file server 402 with the ability to communicate with remote devices, such as the clients 401, over a network and may be, for example, an Ethernet adapter.

Figure 6:
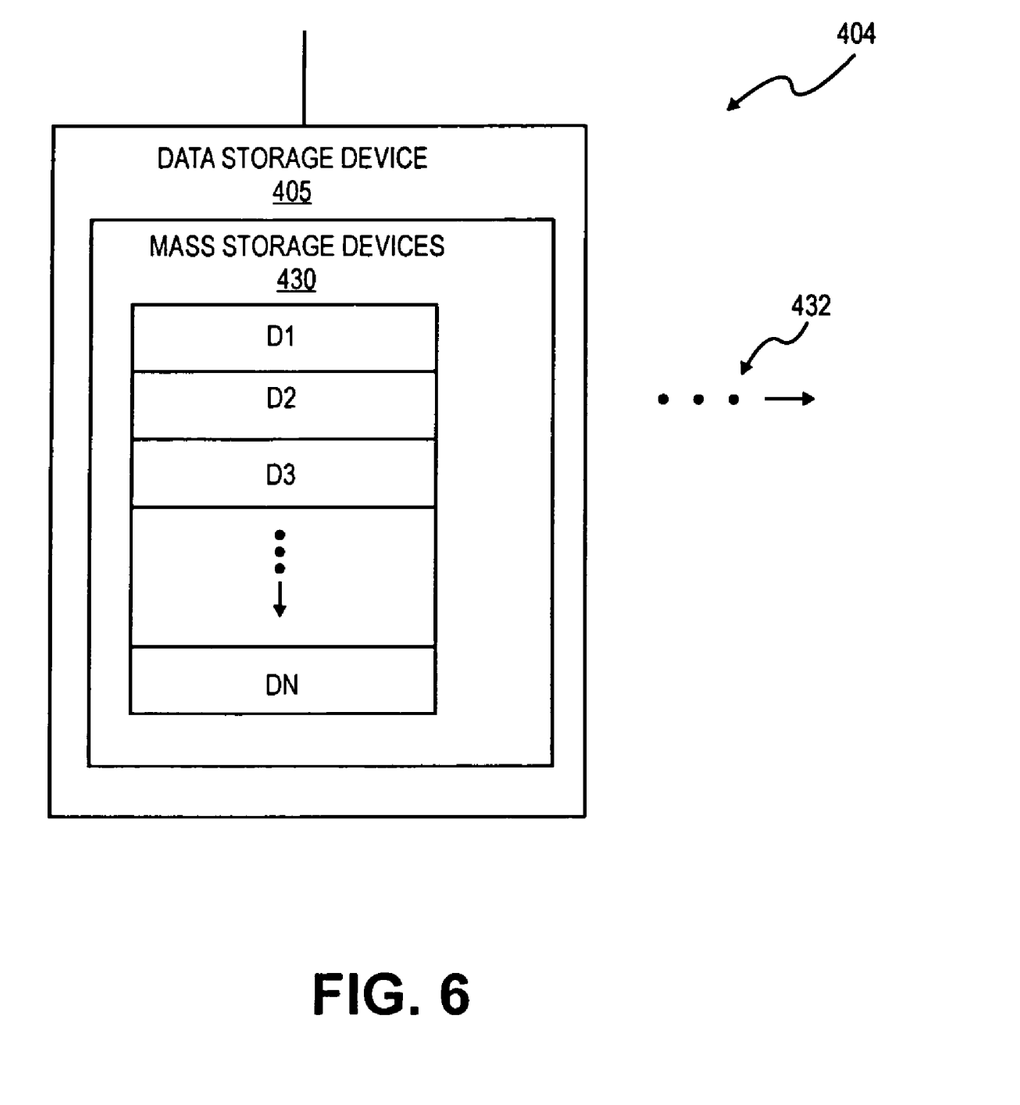
FIG. 6 is a block diagram of a data storage system including mass storage devices in accordance with an embodiment of the invention.

FIG. 6 is a block diagram of a data storage system including mass storage devices in accordance with an embodiment of the invention. For example, FIG. 6 shows an example of a data storage system that can include premium devices and/or mass storage devices selected according to the process of FIGS. 1-2, as well as combined groups of devices and/or mass storage devices as described above with respect to the process of FIG. 3.

FIG. 6 shows storage subsystem 404 including data storage system 405 having mass storage devices 430. As described above, storage subsystem 404 may include more than one of storage systems 405, as indicated by arrow 432 which may represent zero or more additional data storage systems similar to data storage system 405.

Mass storage devices 430 may include one or more mass storage devices as described herein. For example, FIG. 6 shows mass storage devices 430 having mass storage device D1, D2, D3, . . . DN. Thus, mass storage devices 430 may include 1, 2, 4, 8, 10, 20, 40, 80, 100, 200, 400, 800, a combination thereof, or any number of mass storage devices.

In addition, mass storage devices 430 may include devices from various groups selected or identified as described above with respect to FIGS. 1-3. Specifically, devices 430 may include those mass storage devices that are premium as described with respect to 140, those mass storage devices that are standard as described with respect to block 170. Devices identified as premium with respect to block 240, devices identified as standard with respect to block 270. Moreover, devices 430 may include groups of devices combined as described with respect to block 330 of FIG. 3.

Thus, system 405 may be a "premium" system of premium devices as described above with respect to block 140, 240, and/or 330. Alternatively, system 405 may be a "standard" system of standard devices as described above with respect to block 170, block 270, and/or block 330. It is also contemplated that devices 430 may include a mix of premium, standard, and/or other devices. For example, devices 430 may include a mix or premium and standard devices as described herein having different failure rates as described above with respect to block 330. It is also contemplated that devices 430 may include all premium or all standard devices but devices not combined as described above with respect to block 330.

In the foregoing specification, specific embodiments are described. However, various modifications and changes may be made thereto without departing from the broader spirit and scope of embodiments as set forth in the claims. The specification and drawings are, accordingly, to be regarded in an illustrative rather than a restrictive sense.

What is claimed is:

1. A method comprising:
   identifying at least one probable time to failure for each of a plurality of mass storage devices according to a functional test of each mass storage device, the plurality of mass storage devices comprising mass storage devices from a plurality of production batches, wherein the functional test is a tiered test in which a premium test is performed to select a first group of mass storage devices from the plurality of mass storage devices, and a standard test is performed to select a second group of mass storage devices from mass storage devices that do not pass the premium test, and wherein the premium test has a performance threshold more stringent than a performance threshold for the standard test; and
   selecting at least one mass storage device having a first probable time to failure and at least one mass storage device having a second probable time to failure, different from the first probable time to failure, to be combined into one data storage system.

2. The method of claim 1, wherein the standard test determines whether a mass storage device performs according to minimum requirements of a manufacturer s specification.

3. The method of claim 2, wherein the standard test comprises one of an integration test a performance test a read/write speed test, a read/write test for a period of time, a sector defect test, and a stress test.

4. The method of claim 2, wherein the standard test comprises allowing up to a standard number of failed codes according to the manufacturer's specification without failing the mass storage device.

5. The method of claim 4, further comprising identifying a mass storage device that fails the standard test as a real failed mass storage device and a mass storage device that pass the functional test as a standard mass storage device.

6. The method of claim 1, wherein the premium test determines whether a mass storage device performs according requirements greater than minimum requirements of a manufacturer's specification.

7. The method of claim 6, further comprising identifying as failing the premium test a mass storage device having components previously tested by the functional test.

8. The method of claim 6, wherein the premium test comprises a test including one of a test time period that is greater than a period of a test according to a manufacturer's specification, and a test threshold that is more difficult than a test threshold of a test according to the manufacturer's specification.

9. The method of claim 6, wherein the premium test comprises allowing fewer than a standard number of failed codes according to the manufacturer's specification without failing the mass storage device.

10. The method of claim 9, further comprising identifying a mass storage device that fails the premium test as one of a real failed mass storage device and a standard mass storage device, and identifying a mass storage device that pass the functional test as a premium mass storage device.

11. The method of claim 6, wherein a mass storage device that fails the premium test is identified as (1) a standard mass storage device if the mass storage device passed a standard number of failed codes according to the manufacturer's specification without failing the mass storage device, and as (2) a real failed mass storage device if the mass storage device does not passed a standard number of failed codes according to the manufacturer's specification.

12. The method of claim 1, wherein the mass storage devices are a hard disk drives.

13. The method of claim 1, wherein the plurality of production batches comprise batches from a plurality of manufacturers.

14. A method comprising:
selecting from a plurality of disk drives, a first subset of disk drives that are not reworked disk drives, wherein the plurality of disk drives comprise drives from at least one of a plurality of production batches and a plurality of manufacturers;
identifying from the first set a second subset of disk drives that pass a functional test requiring that the first subset perform at least one of for a test time period that is greater than a period of a test according to a manufacturer's specification, at performance thresholds more difficult than minimum thresholds of a test according to a manufacturer's specification. and with fewer failed codes than a minimum allowable number failed codes according to the manufacturer's specification; and
combining drives of the second subset into a data storage system, wherein the combined drives are divided into at least three groups, each group having a different probable time to failure than any other group.

15. The method of claim 14, wherein each of the at least three groups have drives from a different manufacturer than the other groups.

16. The method of claim 14, wherein each of the at least three groups have drives from a different production batch than the other groups.

17. A storage system comprising:
a storage server; and
a plurality of mass storage devices to store data in response to the storage server, including at least one drive selected to have a first probable time to failure and at least one disk drive selected to have a second probable time to failure, different from the first probable time to failure, the plurality of disk drives comprising drives from at least one of: a) a plurality of production batches, and b) a plurality of manufacturers;
wherein the plurality of disk drives are drives that pass a functional test to determine whether a drive performs according to requirements greater than minimum requirements of a manufacturer's specification, and do not include drives having components that have been previously tested by a functional test.

18. The apparatus of claim 17, wherein the first probable time to failure and the at least a different second probable time to failure are determined according to a functional test of each drive.

19. The apparatus of claim 17, wherein the plurality of disk drives comprise drives of a data server.

20. The apparatus of claim 17, wherein the plurality of disk drives comprise drives of a redundant array of independent disks.

21. A method comprising:
reading data from and writing data to a data storage system having at least one mass storage device having a first probable time to failure and at least one mass storage device having a second probable time to failure, different from the first probable time to failure, wherein the first and second probable time to failure consider times to failure identified according to a functional test of a plurality of mass storage devices from a plurality of production batches,
wherein the functional test is a tiered test in which a premium test is performed to select a first group of mass storage devices from the plurality of mass storage devices, and a standard test is performed to select a second group of mass storage devices from mass storage devices that do not pass the premium test and wherein the premium test has a performance threshold more stringent than a performance threshold for the standard test.

22. The method of claim 21, wherein the at least one mass storage device having a first probable time to failure comprises a first Redundant Array of inexpensive Disks (RAID) group, and at least one mass storage device having a second probable time to failure comprises a second RAID group.

23. A method comprising:
reading data from and writing data to a data storage system having a subset of a plurality of disk drives from a plurality of production batches, each disk drive of the subset comprising:
a disk drive that is not a reworked disk drives; and
a disk drive that passed a functional test requiring one of performance for a test time period that is greater than a period of a test according to a manufacturer's specification, performance at thresholds more difficult than minimum thresholds of a test according to a manufacturer's specification. and performance with fewer failed codes than a minimum. allowable number failed codes according to the manufacturer's specification.

24. The method of claim 23, wherein the subset includes at least three groups, each group having a different probable time to failure than any other group.

25. The method of claim 24, wherein each group comprises a Redundant Array of Inexpensive Disks (RAID) group.

* * * * *